United States Patent
Chino et al.

(10) Patent No.: US 8,242,685 B2
(45) Date of Patent: Aug. 14, 2012

(54) ORGANIC ELECTROLUMINESCENCE DEVICE CAPABLE OF PREVENTING LIGHT FROM BEING NOT EMITTED

(75) Inventors: Yuji Chino, Suwa (JP); Suguru Akagawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 58 days.

(21) Appl. No.: 12/420,401

(22) Filed: Apr. 8, 2009

(65) Prior Publication Data

US 2009/0273279 A1 Nov. 5, 2009

(30) Foreign Application Priority Data

May 1, 2008 (JP) ................................ 2008-119862

(51) Int. Cl.
*H01J 1/62* (2006.01)
*H01J 63/04* (2006.01)

(52) U.S. Cl. ........ 313/503; 313/483; 313/500; 313/501; 313/502; 313/504; 313/506; 313/505

(58) Field of Classification Search .................. None
See application file for complete search history.

(56) References Cited

U.S. PATENT DOCUMENTS

| | | | | |
|---|---|---|---|---|
| 6,559,594 | B2 * | 5/2003 | Fukunaga et al. | 313/506 |
| 7,064,482 | B2 * | 6/2006 | Park | 313/504 |
| 2001/0011868 | A1 * | 8/2001 | Fukunaga et al. | 313/506 |
| 2003/0006699 | A1 * | 1/2003 | Ogino et al. | 313/506 |
| 2005/0007015 | A1 * | 1/2005 | Yokoyama et al. | 313/506 |
| 2005/0253508 | A1 * | 11/2005 | Okano | 313/506 |
| 2007/0108899 | A1 * | 5/2007 | Jung et al. | 313/506 |

FOREIGN PATENT DOCUMENTS

| JP | A 2005-158583 | 6/2005 |
|---|---|---|
| JP | A-2007-156388 | 6/2007 |

* cited by examiner

*Primary Examiner* — Natalie Walford
(74) *Attorney, Agent, or Firm* — Oliff & Berridge, PLC

(57) ABSTRACT

An organic electroluminescence device includes an organic electroluminescence element having a function layer interposed between a first electrode and a second electrode. The function layer includes at least an organic light emission layer. The electroluminescence device includes: partition walls which define concave portions and each of formation areas of the organic electroluminescence element within each of the concave portions to arrange the function layer within the concave portion; and auxiliary electrodes which are each arranged continuously on the partition wall and within the concave portion. The second electrode is formed in an area where both the formation area of the organic electroluminescence element and a non-formation area of the organic electroluminescence element overlap with each other, so as to be electrically connected to the function layer and the auxiliary electrode and is formed continuously between the function layer arranged within the concave portion and the auxiliary electrode in a state where the second electrode contacts with the function layer arranged within the concave portion and the auxiliary electrode. The auxiliary electrode is formed to be thicker than the second electrode.

10 Claims, 9 Drawing Sheets

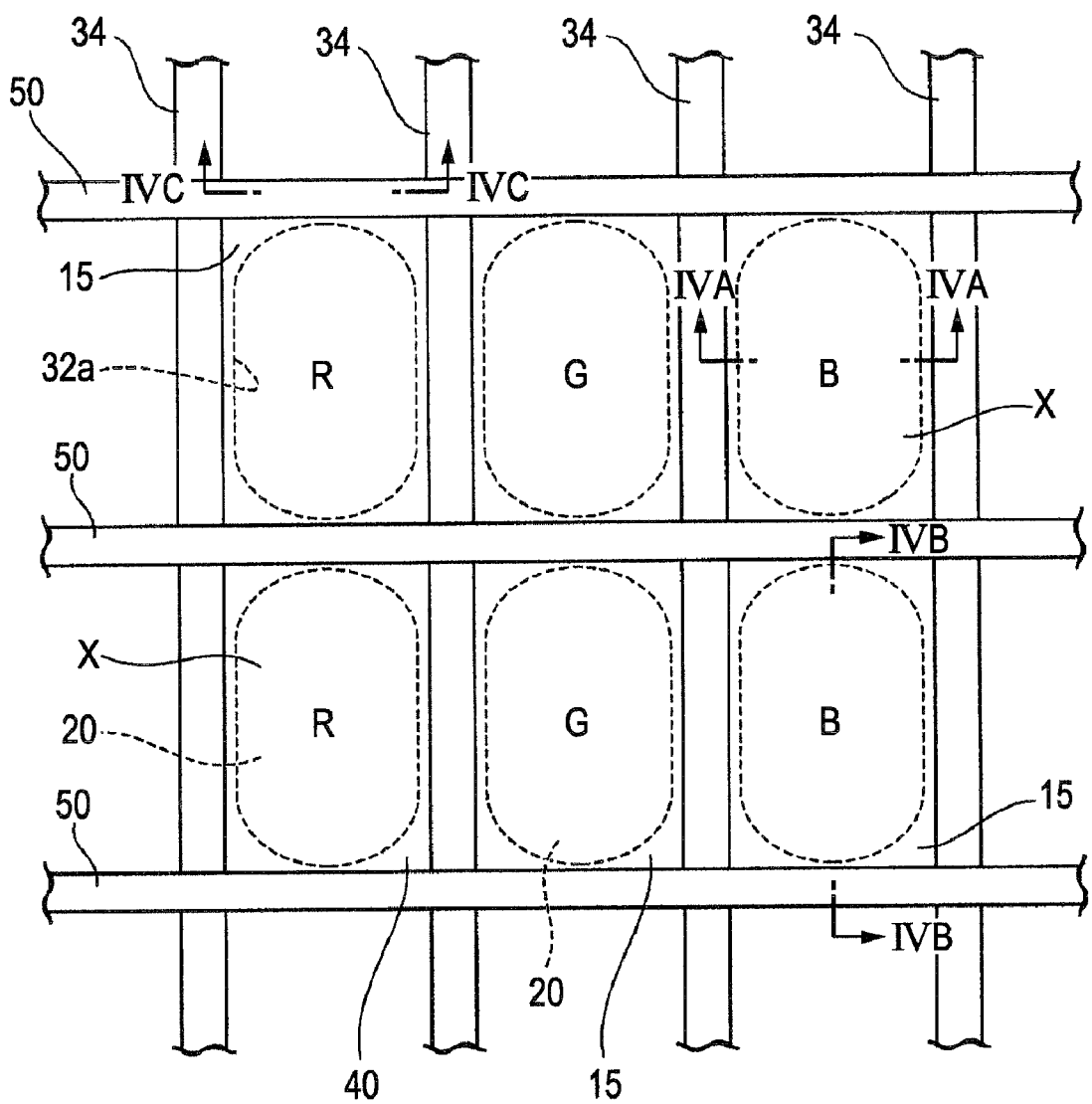

ORGANIC ELECTROLUMINESCENCE DEVICE CAPABLE OF PREVENTING LIGHT FROM BEING NOT EMITTED

BACKGROUND

1. Technical Field

The present invention relates to an organic electroluminescence device.

2. Related Art

In recent years, a demand for flat display devices which consume less electric power and have a lighter weight has increased with an advance in diverse information apparatuses. As one of the flat display devices, an organic electroluminescence device (organic EL device) which performs a display by allowing an organic electroluminescence element (organic EL element) which has a function layer including an organic light emission layer to emit light was suggested.

The organic EL device is classified into two display types, that is, a so-called top emission type in which light emitted by the organic EL element is radiated in a side opposite a substrate for forming the organic EL element and a so-called bottom emission type in which the light emitted by the organic EL element is radiated in a substrate for forming the organic EL element by transmitting the substrate. When these two display types are compared to each other, a top emission type organic EL device is more advantageous in high resolution and high definition of a display picture, since it is easier to improve a pixel aperture ratio.

In the organic EL device, an electrode for radiating the light emitted from the light emission layer needs to have a light transmissive property. Accordingly, in the top emission type, a cathode (electrode) radiating light needs to have the light transmissive property. The light transmissive property is granted to the light transmissive cathode (electrode), by using a transparent conductive material such as ITO (Indium Tin Oxide) or sufficiently forming a metal material (alloy material) such as MgAg in a thin film.

However, in the transparent (light transmissive property) cathode, a resistance value is increased due to a property (conductivity) of a formation material or a small cross-section area of the cathode formed in a thin film. Therefore, in a case of a large-scale organic EL display (organic EL device), since irregularity of brightness between the organic EL elements is caused in the outer circumference and the inside of a display area, for example, due to a voltage drop of the cathode resulting from the increased resistance value, a problem may occur in that a display quality deteriorates due to display unevenness such as light emission unevenness or bright unevenness.

In order to solve this problem, there was suggested a method of realizing a substantially low resistance value of the transparent cathode and solving the problem with the display unevenness by forming an auxiliary wire in state where the auxiliary wire is conductive to the transparent cathode and setting a resistance value of a transparent electrode to a total resistance value obtained by adding the resistance values of the transparent cathode and the auxiliary wire (see JP-A-2005-158583).

However, in the organic EL element, when a polymer material is used for a function layer forming material, a wet coating method (liquid phase method) is used for applying and arranging a liquid substance (function liquid) containing the function layer forming material at a predetermined location and evaporating a solvent to form a desired film (function film) of a formation material.

As one effective method of the various wet coating methods, a manufacture method using a liquid-droplet ejecting method is known. An ink jet method of the liquid-droplet ejecting method has various advantages in that a mask is not necessary in patterning, separate coating of high resolution is possible, less ink is lost, coating of a large area is easy, and the like. Accordingly, the ink jet method is suitable for performing the separate coating to form the function film in a minute pattern, for example, a minute RGB pattern for a full color display, thereby realizing an organic EL device which has a high resolution and a high quality.

In the manufacture method using the liquid-droplet ejecting method, partition walls are provided in the vicinity of an area where the function liquid is coated to partition arrangement locations of the function liquid. When the partition walls are provided, a location precision can be improved and the function liquid coated at one area can be also prevented from being mixed with the function liquid coated in another area.

The partition walls are used not only for the wet coating method but also for a gas phase method such as a vapor deposition method. By using the partition walls, an insulation property can be ensured by preventing short circuit between pixel electrodes (anodes), pixels can be separated from each other even when the function layer is formed on an entire surface by the vapor deposition method, and a problem of not obtaining a desired display performance can be prevented.

The partition walls are formed so as to have a height in the range of about 1 to 3 μm, for example, in accordance with a method of forming the function layer. On the other hand, when the transparent cathode is formed as a thin film in order to guarantee a light transmissive property, the transparent cathode has a thickness in the range of about 5 to 10 nm by the vapor deposition method or the like. For example, the transparent cathode is formed as a thin film so as to have a thickness of about 10 nm, when MgAg is used.

In this case, since the transparent cathode is considerably thinner than the height of the partition walls, step disconnection may occur due to a step difference formed in a side surface of the partition wall. Therefore, line disconnection may occur in a portion covering the function layer formed in a concave portion in the partition wall from the cathode on the partition wall. That is, when the portion covering the function layer of the concave portion in the partition wall is not electrically connected to the cathode, current does not flow in the function layer and thus light is not emitted.

SUMMARY

An advantage of some aspects of the invention is that it provides an organic electroluminescence device capable of preventing light from being not emitted due to step disconnection (line disconnection) caused by a step difference in a partition wall and ensuring a satisfactory display quality.

According to an aspect of the invention, there is provided an organic electroluminescence device which includes an organic electroluminescence element having a function layer interposed between a first electrode and a second electrode. The function layer includes at least an organic light emission layer. The electroluminescence device includes: partition walls which define concave portions and each of formation areas of the organic electroluminescence element within each of the concave portions to arrange the function layer within the concave portion; and auxiliary electrodes which are each arranged continuously on the partition wall and within the concave portion. The second electrode is formed in an area where both the formation area of the organic electroluminescence element and a non-formation area of the organic electroluminescence element overlap with each other, so as to be electrically connected to the function layer and the auxiliary electrode and is formed continuously between the function layer arranged within the concave portion and the auxiliary electrode in a state where the second electrode contacts with the auxiliary electrode and the function layer arranged within the concave portion. The auxiliary electrode is formed to be thicker than the second electrode.

According to the organic electroluminescence device, the second electrode is formed in the area where both the formation area of the organic electroluminescence element and the non-formation area of the organic electroluminescence element overlap with each other, so as to be electrically connected to the function layer and the auxiliary electrode and is formed continuously between the function layer arranged within the concave portion and the auxiliary electrode in the state where the second electrode contacts with the function layer arranged within the concave portion and the auxiliary electrode. Accordingly, even when step disconnection occurs in the second electrode due to a step difference of the partition wall, the second electrode contacts with the auxiliary electrode formed within the concave portion and thus the upper portion of the partition wall causing the step disconnection is conductively connected to the inside of the concave portion through the auxiliary electrode. Since the second electrode contact with the function layer arranged within the concave portion, sufficient current flows in the function layer of the formation area of the organic electroluminescence element, thereby realizing satisfactory light emission. In addition, since the auxiliary electrode is thicker than the second electrode, the step disconnection rarely occurs due to the step difference of the partition wall. As a result, the organic electroluminescence device can prevent the light from being not emitted due to the step disconnection (line disconnection) caused due to the step difference of the partition wall and can realize a high display quality.

In organic electroluminescence device according to this aspect of the invention, the partition walls may be arranged in a stripe shape and the concave portions are arranged in a stripe shape between the partition walls, and the auxiliary electrodes may be arranged in a stripe shape intersecting the partition walls. In this case, the first electrode may be formed in an island area defined by one pair of adjacent auxiliary electrodes and one pair of adjacent partition walls.

In organic electroluminescence device according to this aspect of the invention, the second electrode contacts with the auxiliary electrode in the concave portion having the stripe shape. Therefore, even when the step disconnection occurs in the second electrode due to the step difference of the partition wall, the upper portion on the partition wall causing the step disconnection is conductively connected to the inside of the concave portion through the auxiliary electrode.

When the first electrode is formed in the island shape in the area defined by one pair of adjacent partition walls and one pair of adjacent auxiliary electrodes, a portion corresponding to the first electrode formed in the island shape serves as an independent light emission element.

In organic electroluminescence device according to this aspect of the invention, each of the concave portions formed on the sides of the partition walls may include a first concave portion for arranging the formation area of the organic electroluminescence element and a second concave portion for arranging the non-formation area of the organic electroluminescence element and providing the auxiliary electrode.

With such a configuration, a portion within the first concave portion overlaps with the auxiliary electrode within the second concave portion, since the second electrode is formed continuously between the first concave portion and the second concave portion. Therefore, even when the step disconnection occurs in the second electrode due to the step difference of the partition wall, the upper portion of the partition wall causing the step disconnection is conductively connected to the inside of the first concave portion through the auxiliary electrode,.

In organic electroluminescence device according to this aspect of the invention, the concave portion may be surrounded by the partition walls, the function layer may be arranged in the formation area of the organic electroluminescence element within the concave portion, and the auxiliary electrode may be arranged in the non-formation area of the organic electroluminescence element within the concave portion, so that the second electrode is continuously formed between the auxiliary electrode and the function layer arranged within the concave portion.

With such a configuration, since the second electrode is continuously formed between the function layer and the auxiliary electrode within the concave portion, the upper portion of the partition wall causing the step disconnection is conductively connected to the inside of the concave portion through the auxiliary electrode, even when the step disconnection occurs in the second electrode due to the step difference of the partition wall.

In organic electroluminescence device according to this aspect of the invention, the second electrode may be formed of MgAg. When the second electrode is formed of MgAg, the thickness is about 10 nm. Even when the height of the partition wall is about 2 μm, satisfactory light emission performance can be obtained in the configuration described above.

In organic electroluminescence device according to this aspect of the invention, the auxiliary electrode may be formed of a material having a higher conductive property than that of the second electrode.

With such a configuration, resistance obtained by a sum of the resistances of the second electrode and the auxiliary electrode can be lowered. Accordingly, it is possible to realize substantially low resistance of the second electrode and remove the display unevenness.

In organic electroluminescence device according to this aspect of the invention, the auxiliary electrode may have a thickness of 200 nm or more.

With such a configuration, even when the height of the partition wall is in the range of about 1 to 3 μm, the step disconnection (line disconnection) can be prevented from occurring in the auxiliary electrode due to the step difference of the partition wall.

In organic electroluminescence device according to this aspect of the invention, the auxiliary electrode may be formed by a mask vapor-deposition method.

By forming the auxiliary electrode by the mask vapor-deposition method, it is possible to form the auxiliary electrode in a desired pattern without damage to the function layer which is caused by etching.

In organic electroluminescence device according to this aspect of the invention, the auxiliary electrode may be formed of Al.

Since the resistance of Al is low and the film can be formed by vapor deposition, it is possible to realize substantially low resistance of the second electrode and form the film in a desired pattern by the mask vapor-deposition method.

BRIEF DESCRIPTION OF THE DRAWINGS

The invention will be described with reference to the accompanying drawings, wherein like numbers reference like elements.

FIG. 3 is an enlarged top view illustrating major constituent elements of the organic EL device according to a first embodiment.

DESCRIPTION OF EXEMPLARY EMBODIMENTS

Hereinafter, an organic electroluminescence device (hereinafter, referred to as an organic EL device) according to the invention will be described with reference to the drawings. In the referred drawings, the sizes or the like of constituent elements are appropriately scaled for easy view of the drawings.

First, the overall configuration of the organic EL device according to the invention will be described with reference to FIGS. 1 and 2.

Figure 1:
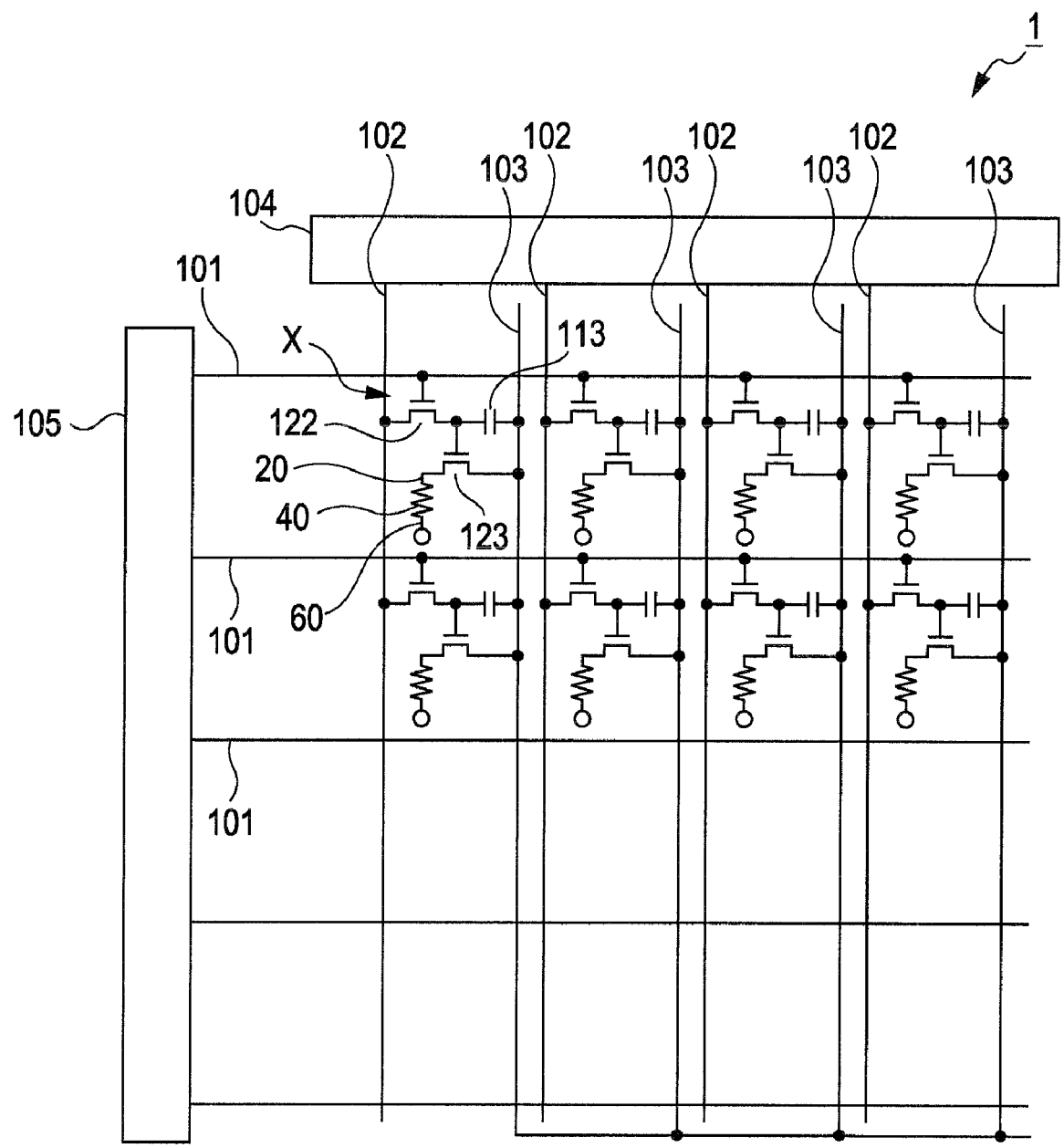
FIG. 1 is a schematic diagram illustrating a wiring structure of an organic EL device according to the invention.

FIG. 1 is a schematic diagram illustrating a wiring structure of an organic EL device 1 according to the invention. The organic EL device 1 has the wiring structure in which plural scanning lines 101, plural signal lines 102 extending to be substantially perpendicular to the scanning lines 101, and plural power lines 103 extending to be parallel to the signal lines 102 are formed in an active matrix method using thin film transistors (hereinafter, referred to as TFTs) as a switching element. In the organic EL device 1, a sub-pixel X is formed in the vicinity of each of intersections between the scanning lines 101 and the signal lines 102. According to the technical spirit of the invention, the same advantages can be obtained at low cost, even when the invention is embodied by using not the active matrix method using the TFTs but a simple matrix method to drive an element substrate for the simple matrix method.

The signal lines 102 are connected to a data line driving circuit 104 which includes a shift resistor, a level shifter, a video line, and an analog switch. The signal lines 101 are connected to scanning line driving circuits 105 which each include a shift resistor and a level shifter.

Each of the sub-pixels X includes a switching TFT 112 in which a scanning signal is supplied to a gate electrode through each of the scanning lines 101, a holding capacitor 113 which holds a pixel signal shared from the signal line 102 through the switching TFT 112, a driving TFT 123 in which the pixel signal held by the holding capacitor 113 is supplied to a gate electrode, a pixel electrode (anode, first electrode) 20 to which driving current flows from the power line 103 when the pixel electrode 20 is electrically connected to the power line 103 through the driving TFT 123, and a function layer 40 which is interposed between the pixel electrode 20 and a common electrode (cathode, second electrode) 60.

In the organic EL device 1, when each of the scanning lines 101 is driven to turn on the switching TFT 112, the potential of the signal line 102 is held in the holding capacitor 113 and the driving TFT 123 is turned on or off depending on the state of the holding capacitor 113. Then, current flows from the power line 103 to the pixel electrode 20 through a channel of the driving TFT 123 and flows to the common electrode 60 through the function layer 40. In this way, organic light emission layer included in the function layer 40 emits light in accordance with an amount of flowing current.

Figure 2:
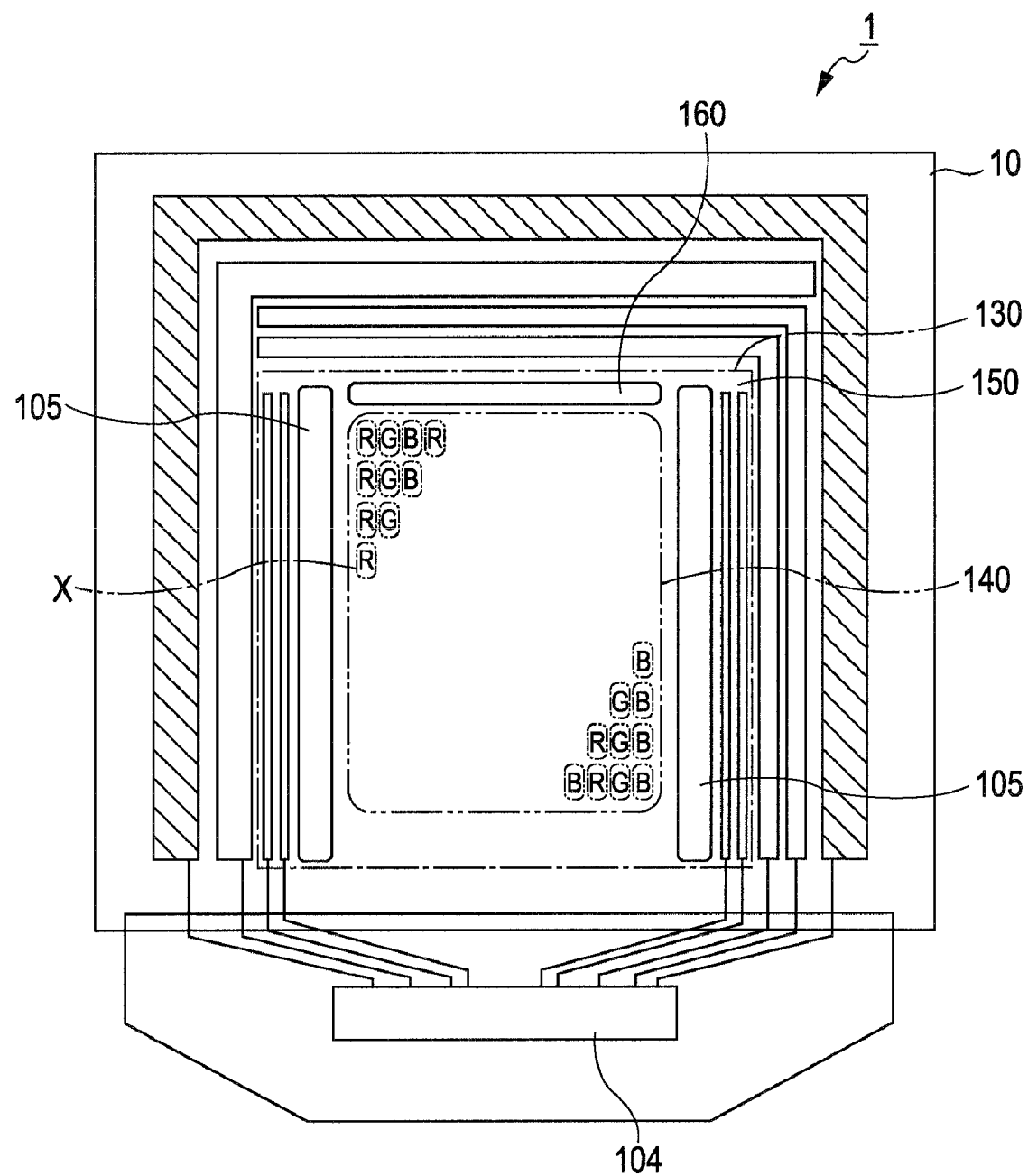
FIG. 2 is a top view schematically illustrating the configuration of the organic EL device according to the invention.

FIG. 2 a top view schematically illustrating the configuration of the organic EL device 1 according to the invention.

As shown in FIG. 2, the organic EL device 1 includes a substrate 10. A pixel area 130 having a rectangular shape in plan view is formed in the substrate 10. The pixel area 130 is divided into an actual display area 140 where the sub-pixels X are arranged in a matrix shape and a dummy area 150 which is formed around the actual display area 140.

The function layer 40 included in each of the sub-pixels X can radiate one of red (R) light, green (G) light, and blue (B) light by light emission in this embodiment. However, as described below, it can be configured to emit white light while R light, G light, and B light are output by color filters corresponding to R, G, and B.

In the actual display area 140, the same color sub-pixels X are arranged vertically in the drawing to form so-called stripe arrangement. In addition, the actual display area 140, full color display is realized by mixing the RGB light output from the sub-pixels X arranged in the matrix shape.

The scanning line driving circuits 105 are disposed on both sides of the actual display area 140 in FIG. 2. The scanning line driving circuits 105 are disposed in a lower layer of the dummy area 150. An inspection circuit 160 is disposed on the upper side of the actual display area 140 in FIG. 2. The inspection circuit 160 is disposed in a lower layer of the dummy area 150. The inspection circuit 160 is a circuit which inspects operation states of the organic EL device 100. For example, the inspection circuit 160 includes an inspection information outputting unit (not shown) for outputting an inspection result to the outside so as to inspect a quality and a defect of the display device during manufacture or in shipment.

First Embodiment

Figure 4A:
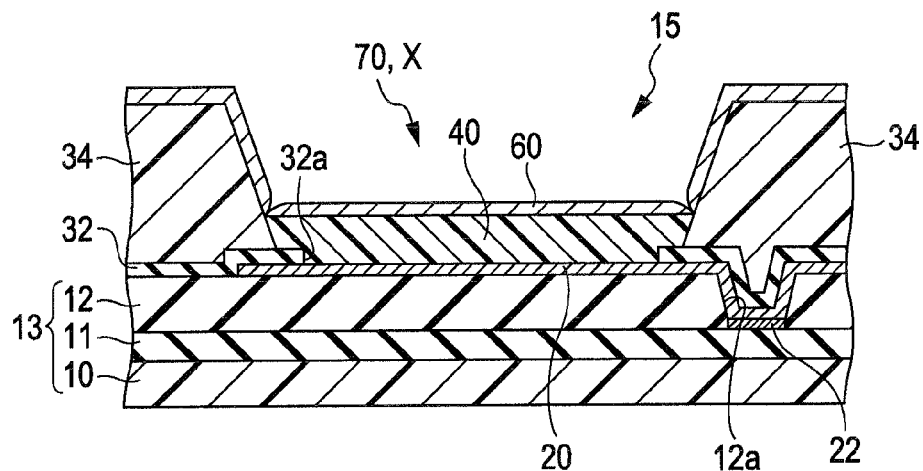
FIGS. 4A to 4C are sectional view of FIG. 3.
Figure 4B:
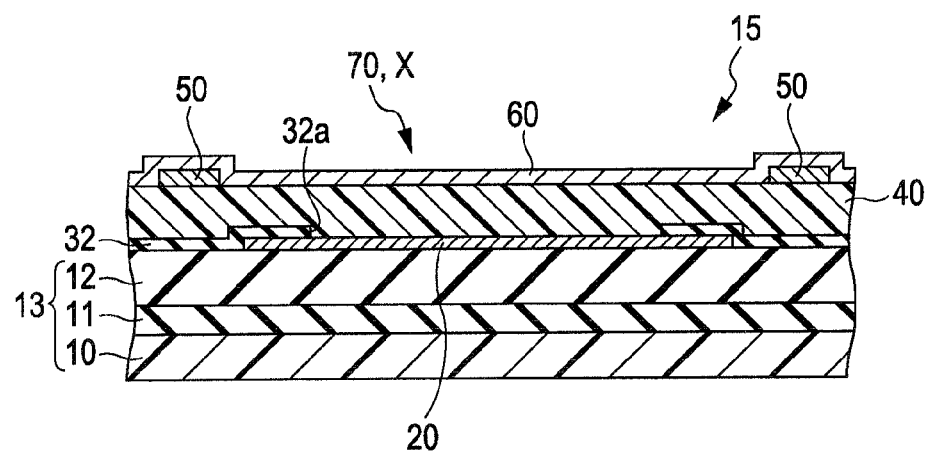
Figure 4C:
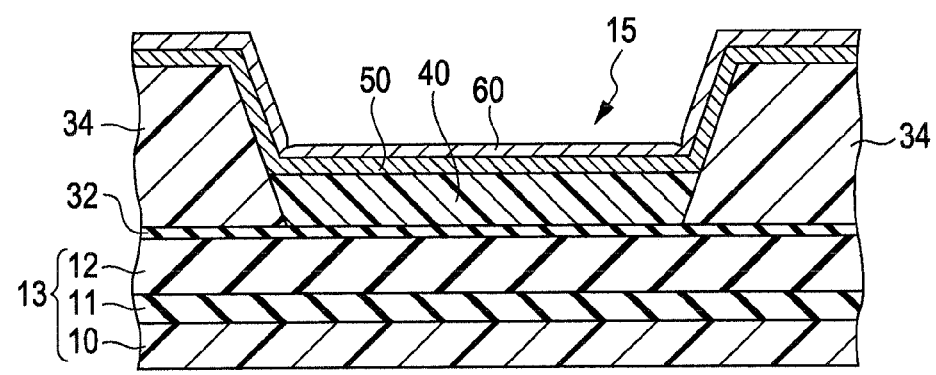

Next, a specific configuration example of the organic EL device will be described with reference to a first embodiment of the invention. FIG. 3 is an enlarged top view illustrating major constituent elements of the organic EL device according to the first embodiment of the invention. FIG. 4A is a sectional view taken along the line IVA-IVA of FIG. 3. FIG. 4B is a sectional view taken along the line IVB-IVB of FIG. 3. FIG. 4C is a sectional view taken along the line IVC-IVC of FIG. 3.

In the organic EL device 1 according to this embodiment, as shown in FIG. 3, numerous partition walls 34 are arranged in a stripe shape. Each of concave portions 15 is formed between the adjacent partition walls 34. Numerous auxiliary cathode wires (auxiliary electrodes) 50 perpendicular (intersected) to the partition walls 34 are arranged in a stripe shape. Here, the stripe shape includes a shape in which the numerous partition walls 34 are connected to each other in ends or numerous auxiliary cathode wires 50 are connected to each other in ends.

As indicated by a dashed line in FIG. 3, each of the plural sub-pixels X having an elliptical shape (track shape) in plan view is formed inside a rectangular area defined by a pair of adjacent partition walls 34 and a pair of adjacent auxiliary electrodes 50. Here, the shape of the sub-pixel X in plan view corresponds to the shape of the pixel electrode (first electrode) 20 in plan view, which is exposed inside the concave portion 15. Each of the pixel electrodes 20 is independently formed in an island shape in each of the sub-pixels X. Accordingly, each of the sub-pixels X is independently formed to serves as an independent light emission element.

In this embodiment, a shown in FIG. 3, the partition walls 34 are arranged in the stripe shape vertically in the drawing and the auxiliary cathode wires 50 are arranged horizontally in the stripe shape in the drawing. Conversely, the partition walls 34 may be arranged horizontally in the drawing and the auxiliary cathode wires 50 may be arranged vertically in the drawing.

As shown in FIGS. 4A and 4B, the organic EL device 1 includes a base substrate 13, the pixel electrodes 20 which is formed above the base substrate 13, an insulating film 32 which covers the circumference of each of the pixel electrodes 20 to expose the pixel electrode 20 from an opening 32a, a function layer 40 which is formed to cover the exposed surface of each of the pixel electrodes 20, and a common electrode 60 which covers at least the function layer 40 and is formed above the base substrate 13. In this embodiment, an organic EL element 70 is formed by each of the pixel electrodes (anodes, first electrodes) 20 exposed within the opening 32a of the insulating film 32, the function layer 40, and the common electrode (cathode, second electrode) 60 covering the function layer 40. In the organic EL device 1 according to this embodiment, a top emission type of outputting light emitted from the organic EL element 70 to the common electrode 60 is used.

The base substrate 13 includes a substrate 10 and an element layer 11 which is formed on the substrate 10 and includes wires, driving elements, or the like. Since the substrate 10 uses the top emission type in this embodiment, both a transparent substrate and an opaque substrate can be used. Examples of the opaque substrate include a substrate formed by performing an insulating process such as a surface oxidation on ceramics such as alumina or a metal sheet such as stainless steel, a thermo-hardening resin, a thermoplastic resin, and a film (plastic film). Examples of the transparent substrate include an inorganic material such as glass, quartz glass, and silicon nitride and an organic polymer (resin) material such as an acrylic resin and a polycarbonate resin. A composite material formed by laminating or mixing the above-mentioned substances can be used. In this embodiment, the opaque plastic film mentioned above is used as a material of the substrate 10.

The element layer 11 includes various wires for driving the organic EL device 1, the driving elements such as the switching TFTs or the driving TFTs shown in FIG. 1, and an insulating film such as an inorganic material or an organic material. The various wires or the driving element are formed by performing a patterning process by use of a photolithography technique or an etching technique. In addition, the insulating film is formed by a known film forming method such as a vapor-deposition method, a CVD method, and a sputter method.

As shown in FIG. 4A, an electrode 22 connected to a source electrode of each of the driving TFTs (not shown) included in the element layer 11 is formed on the element layer 11. A flattened layer 12 is formed on the element layer 11 so as to cover the electrode 22. The flattened layer 12 is formed in order to remove unevenness caused due to constituent elements formed in the element layer 11 and to realize a flatted surface suitable for forming the organic EL element. An organic insulating material such as acrylic resin or an inorganic insulating material is used as a material for forming the flattened layer 12.

Contact holes 12a each communicating with each of the electrodes 22 are formed in the flattened layer 12 and each of the pixel electrodes 20 is formed in each of areas on the flattened layer 12 including the contact holes 12a. With such a configuration, electrode 22 and the pixel electrode 20 are electrically connected to each other through the contact hole 12a.

The pixel electrode 20 is formed of a material which has a work function of 5 eV or more and is formed of a material having an excellent hole injection effect. As this material, metallic oxide such as ITO (Indium Tin oxide) is used. In this embodiment, since the top emission type is used, the pixel electrode 20 does not need to have a light-transmitting property. Accordingly, in this embodiment, a lamination configuration in which a light reflecting metal layer such as Al having a light-reflecting property is laminated below a transparent conductive layer formed of the ITO is used. The pixel electrode 20 is formed by the lamination configuration. Each of the pixel electrodes 20 is independently formed in an island shape by forming a film by a known film forming method and patterning the film.

The insulating film 32 is formed on the flattened layer 12. A part of the insulating film 32 is placed on the circumferential of the each of the pixel electrodes 20 and covers the circumference to expose the pixel electrode 20 from an opening 32a. As indicated by a dashed line in FIG. 3, the opening 32a is formed in an elliptical shape (track shape) in plan view. The insulating film 32 is formed of an inorganic insulating material such as oxide silicon ($SiO_2$), silicon nitride (SiN), or silicon oxynitride (SiON) and is sufficiently thinner than the partition wall 34, as described below. In addition, the openings 32a are formed by a known patterning method such as etching. Accordingly, a step rarely occurs between the upper surface of the insulating film 32 and the upper surface of the pixel electrode 20 exposed from the opening 32a. As a result, the upper surface of the insulating film 32 and the upper surface of the pixel electrode 20 form a nearly flat surface.

As shown in FIG. 4A, the partition walls 34 are formed on the insulating film 32. As shown in FIG. 3, the partition walls 34 are formed in the stripe shape. In addition, each of the concave portions 15 is formed between the adjacent partition walls 34. Each of the openings 32a of the insulating film 32 is disposed within each of the concave portions 15. Accordingly, the pixel electrode 20 is exposed within the concave portion 15. The partition walls 34 are formed of an organic material such as acrylic resin and formed in the stripe shape by a known patterning method. The partition walls 34 have a height in the range of 1 to 3 μm. In this embodiment, the partition walls 34 have a height of about 2 μm.

The function layer 40 is formed within the concave portion 15. The function layer 40 includes an organic light emission layer formed of a low-molecular organic EL material. As the configuration of the function layer 40, there are known a configuration in which a hole injection layer, a hole transport layer, an organic light emission layer, an electron transport layer, and an electron injection layer are sequentially laminated from a side of the anode (the pixel electrode 20), a configuration in which the hole transport layer or the electron transport layer are omitted, a configuration in which a hole injection/transport layer having both functions of the hole injection layer and the hole transport layer is used, or a configuration in which an electron injection/transport layer having both functions of the electron injection layer and the electron transport layer is used. In this embodiment, an appropriate configuration is selected and used.

As the material of the function layer 40, a known material can be used. Specifically, the following material can be used.

Examples of the material of the hole injection layer include polythiophene derivative, polyaniline derivative, and polypyrrole derivative.

Examples of the material of the hole transport layer include TAPC, TPD, α-NPD, m-MTDATA, 2-TNATA, TCTA, spiro-TAD, (DTP) DPPD, HTM1, TPTE1, NTPA, TFLTF, polyfluorene derivative (PF), poly-para-phenylene vinylene derivative (PPV), poly-para-phenylene derivative (PPP), polyvinylcarbazole (PVK), polythiophene derivative, and polysilane-based organic polymer material such as poly-methylphenylsilance (PMPS).

Examples of the organic light emission material include rubrence, perylene, 9,10-diphenylanthracene, tetraphenyl butadiene, Nile red, coumalin 6, a low-molecular organic material such as quinacridone, and a phosphorescence material such as CBP(4,4.-dicarbazole 4,4-biphenyl) derivative, PtOEP (platinum porphyrin complex) derivative, Ir(ppy) 3 (iridium complex) derivative, and FIrpic (iridium complex) derivative in addition to the material for forming the hole transport layer. In this embodiment, as the organic light emission material, materials for emitting red (R) light, green (G) light, and blue (B) light are used. As indicated by R, G, and B in FIG. 3, a red sub-pixel X, a green sub-pixel X, and a blue sub-pixel X are arranged in the concave portions 15 arranged in the stripe shape, respectively. The sub-pixels X are repeatedly arranged horizontally in the concave portions 15 in order of red, green, and blue. Alternatively, white light may be emitted for the organic light emission layer, as described below.

Examples of the electron transport layer include oxadiazole derivative, oxazole derivative, phenathrolin derivative, anthrax quinodimethane derivative, benzoquinone derivative, naphthoquinone derivative, anthrax quinine derivative, tetracyano-anthraquino-dimethane derivative, fluorenone derivative, diphenyl dicyanoethylene derivative, diphenoquinone derivative, and hydroxyquinoline derivative.

Here, the partition walls 34 are not formed in the concave portions 15 in a longitudinal direction of the concave portions 15, that is, a longitudinal direction of the partition walls 34, as shown in FIG. 4B. The function layer 40 is formed to be almost flattened on the insulating film 32 exposed within the concave portion 15 and the pixel electrode 20 within the opening 32a. In addition, the function layer 40 is formed only within each of the concave portions 15 other than the upper portion of the partition walls 34, by selectively forming a film within each of the concave portions 15 by a vapor-deposition method using a mask.

The auxiliary cathode wire (auxiliary electrode) 50 is formed on the function layer 40. The auxiliary cathode wire 50 is disposed between the adjacent openings 32a without being disposed immediately on the opening 32a of the insulating film 32. The auxiliary cathode wire 50 is formed of a material having a higher conductive property than that of the common electrode 60 described below. Specifically, a metal material such as gold, silver, copper, aluminum, and chrome having low resistance is used as the material having the higher conductive property. In this embodiment, the auxiliary cathode wires 50 are formed of Al in the stripe shape to be selectively formed by a vapor-deposition method (mask vapor-deposition method) using a mask, that is, to be substantially perpendicular to the partition walls 34.

The auxiliary cathode wire 50 has a thickness of about 200 nm and thus is sufficiently thinner than the height of 2 μm of the partition wall 34. Accordingly, a big step is configured not to be formed with the function layer 40 as an underlying layer. The thickness of the auxiliary cathode wire 50 is sufficiently thinner than the height of the partition wall 34, but sufficiently thicker than the thickness of the common electrode 60 described below. Accordingly, as shown in FIG. 4C, step disconnection (line disconnection) does not occur in the auxiliary cathode wire 50 between the upper portion of the partition wall 34 and the upper portion of the function layer 40. The auxiliary cathode wire 50 covers a step difference formed between the partition wall 34 and the function layer 40.

As shown in FIGS. 4A to 4C, the partition walls 34, the function layers 40, and the auxiliary cathode wires 50 are covered with the common electrode (cathode, second electrode) 60. In this embodiment, since the common electrode 60 is of the top emission type and serves as radiating light, the common electrode 60 is formed to have a light transmissive property. In this embodiment, the common electrode 60 is formed of MgAg so as to have a thickness of about 10 nm by a vapor-deposition method.

Due to the thickness and thinness formation, the common electrode 60 forms a large step difference between the partition wall 34 and the function layer 40 within the concave portion 15, as shown in FIG. 4A. Accordingly, the step disconnection (line disconnection) may occur in a boundary (a boundary between the partition wall 34 and the function layer 40) of the large step difference. In a related art, since a portion covering the function layer 40 of the concave portion 15 in the partition wall 34 is not electrically connected to the common electrode 60 on the partition wall 34, current does not flow in the function layer 60.

In this embodiment, however, the step disconnection (line disconnection) does not occur in the auxiliary cathode wire 50 by the partition wall 34, as shown in FIG. 4C. In addition, the common electrode 60 is electrically joined with the auxiliary cathode wire (auxiliary electrode) 50 to be electrically connected within the concave portion 15 and above the partition wall 34, as shown in FIG. 4B. Accordingly, the common electrode 60 above the partition walls 34 is conductively connected to the insides of the concave portions 15 through the auxiliary cathode wires 50, even when the line disconnection occurs with the common electrode 60 within the concave portions 15 due to the step difference in the partition walls 34. Accordingly, the common electrode 60 is electrically connected to the function layers 40 within the concave portions 15. The common electrode 60 is connected to cathode contact portions connected to cathode extraction terminals (not shown). The auxiliary cathode wires 50 may be connected to the cathode contact portions. In this embodiment, the common electrode 60 is formed on the auxiliary cathode wires 50. In other words, the auxiliary cathode wires 50 are formed below the common electrode 60, but the auxiliary cathode wires 50 may be formed on the common electrode 60. In this case, the step disconnection (line disconnection) does not occur in the auxiliary cathode wires 50 due to the step difference of the partition wall 34 and the common electrode 60 is in contact with the auxiliary cathode wires 50 within the concave portions 15 and above the partition walls 34. Therefore, like the this embodiment, the common electrode 60 is conductively connected to the inside of the concave portions 15 and thus electrically connected to the function layers 40 inside the concave portions 15 through the auxiliary cathode wire 50 even when the line disconnection occurs with the common electrode 60 within the concave portions 15 due to the step difference in the partition walls 34. The same is applied to second and third embodiments described below.

With such a configuration, the pixel electrode 20, the function layer 40, and the common electrode 60 form the organic EL element 70. That is, when voltage is applied between the pixel electrode 20 and the common electrode 60, holes are injected into the hole injection layer from the pixel electrode 20 and the holes are transported to the organic light emission layer through the hole transport layer. In addition, electrons are injected into the electron injection layer from the common electrode 60 and the electrons are transported to the organic light emission layer through the electron transport layer. Then, the holes and the electrons transported to the organic light emission layer are recombined to each other and thus the organic light emission layer emits light.

The light output from the organic light emission layer to the pixel electrodes 20 is transmitted through the transparent conductive layer, reflected from the light reflecting metal layer, and again incident on the organic light emission layer. In addition, since the conductive layer of the common electrode 20 serves as a transflective reflecting film, light other than light having a predetermined wavelength range is reflected from the metal layer to reciprocate between the transparent conductive layer and the light reflecting metal layer. Only light having a resonant wavelength corresponding to an optical distance between the transparent conductive layer and the light reflecting metal layer is amplified and radiated. That is, the space between the transparent conductive layer and the light reflecting metal layer serves a resonator. Accordingly, light having high light emission brightness and sharp spectrum can be output. In addition, the optical distance is calculated by a sum of optical distances of layers included between the transparent conductive layer and the light reflecting metal layer. An optical distance of each layer is calculated by multiplying the film thickness and a reflective index of each layer.

Even though not shown, a transparent sealing film for shielding moisture or oxygen is formed on the surface of the common electrode 60. A transparent protection member (sealing substrate) such as glass, plastic, and a resin film is attached on the transparent sealing film through a transparent adhesive.

When current is applied to the organic EL device 1, the current flowing in the organic EL element 70 also flows in the common electrode 60 and the auxiliary cathode wires 50. Therefore, an actual resistance value is lowered on the whole in the cathode and thus electric conductivity is increased. Accordingly, irregularity of brightness resulting from a voltage drop caused due to high resistance of the cathode is solved.

In the organic EL device 1 according to this embodiment, all the sub-pixels X formed by the organic EL elements 70 (light emission elements) can light on and off, even though the step disconnection (line disconnection) particularly occurs in the common electrode 60 due to the step difference in the partition walls 34. That is because the common electrode 60 on the partition walls 34 and common electrode 60 within the concave portions 15 through the auxiliary cathode wires 50. Moreover, since the irregularity of the brightness is solved, a high-quality display performed can be realized without display unevenness such as light emission unevenness or bright unevenness.

In the first embodiment, the sub-pixel X corresponding one of red (R), green (G), and blue (B) is arranged within each of the concave portions 15 is formed between the partition walls 34. However, the sub-pixels X of three red (R), green (G), and blue (B) colors may be arranged within each of the concave portions 15 in a row and a pixel formed by the sub-pixels X of the three colors within one concave portion 15. Alternatively, plural pixels may be arranged within one concave portion 15.

In the first embodiment, each of auxiliary cathode wires 50 is disposed between the sub-pixels X arranged in the longitudinal direction of the concave portion 15. However, the auxiliary cathode wires 50 may thin out to some extent without being formed between the entire sub-pixels X in a range in which a wire resistance of the common electrode 60 is not nearly affected.

Second Embodiment

Figure 5:
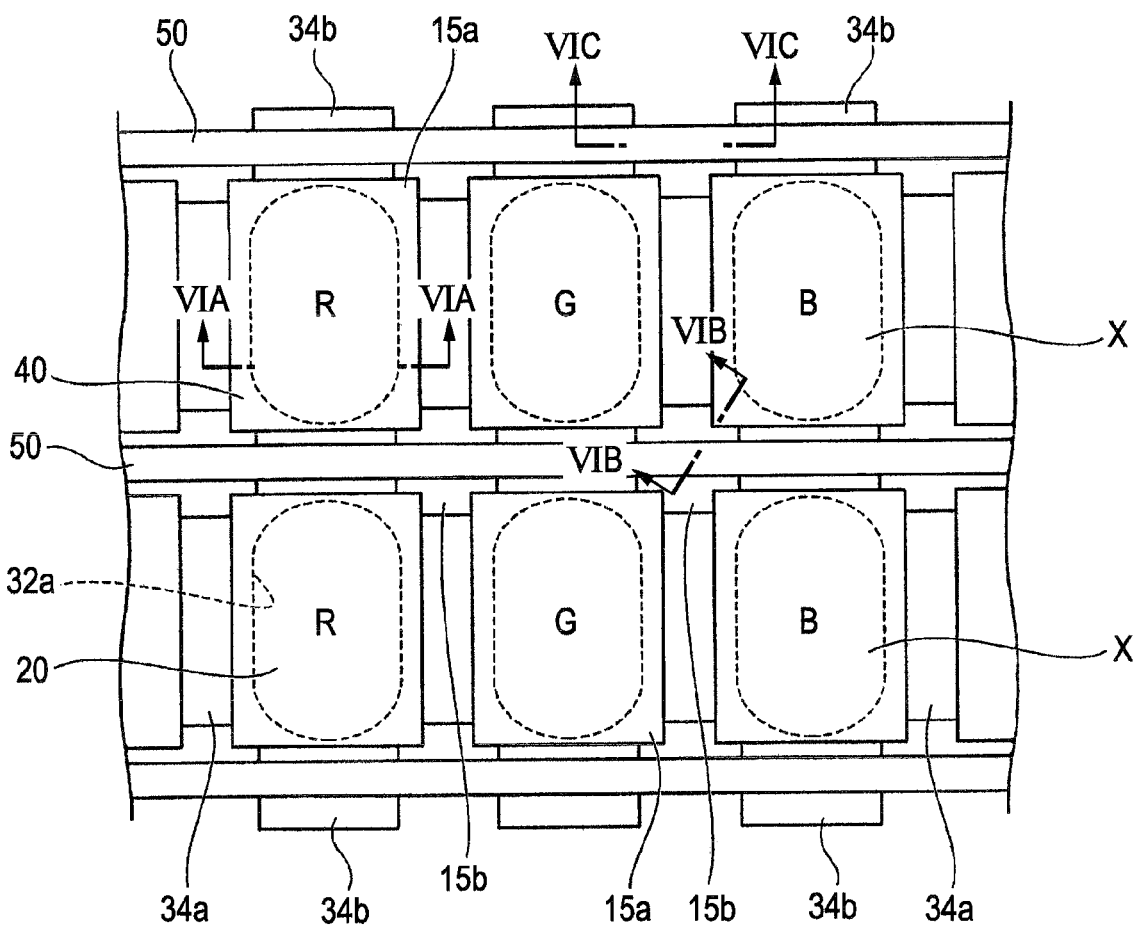
FIG. 5 is an enlarged top illustrating major constituent elements of the organic EL device according to a second embodiment.
Figure 6A:
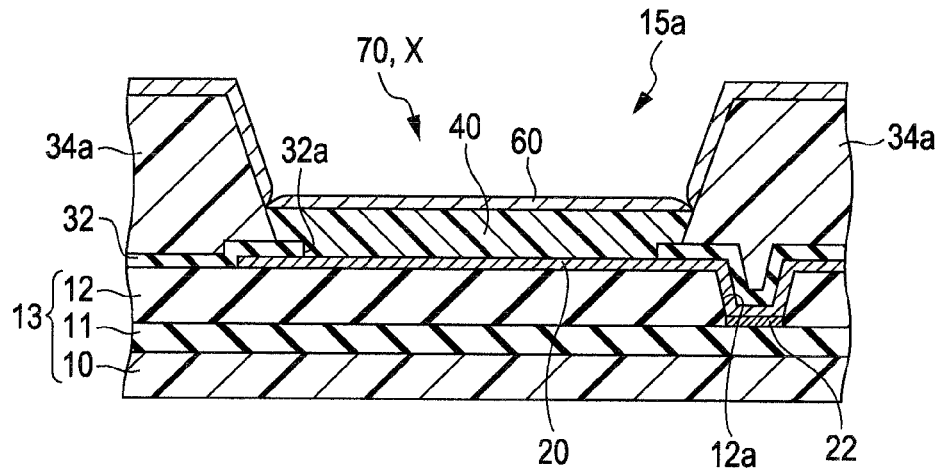
FIGS. 6A to 6C are sectional view of FIG. 5.
Figure 6B:
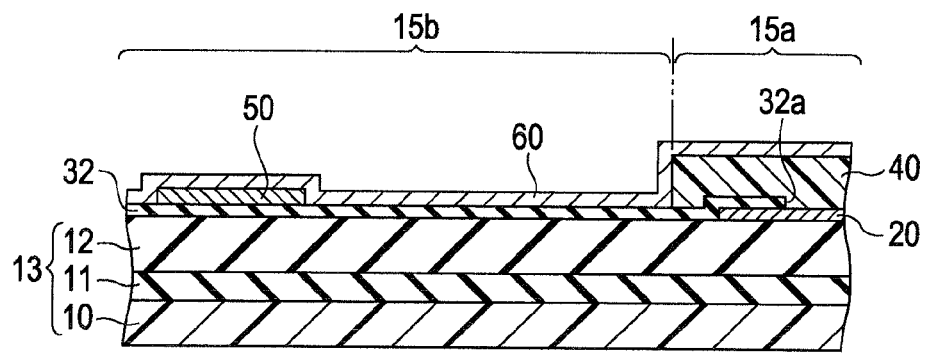
Figure 6C:
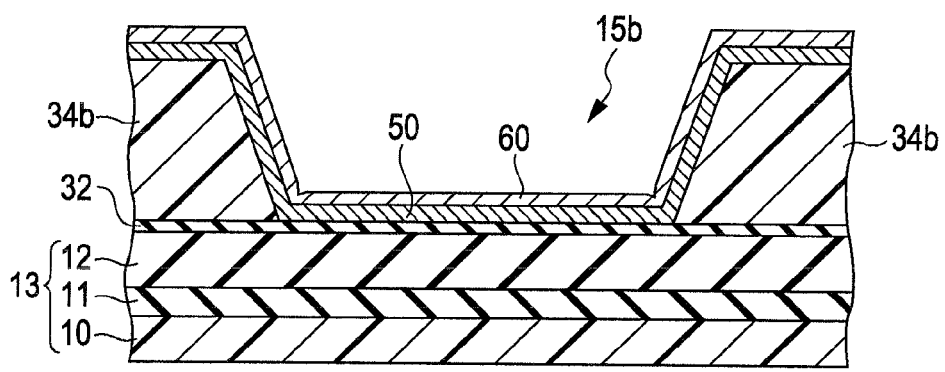

Next, an organic EL device will be described according to a second embodiment of the invention, FIG. 5 is an enlarged top illustrating major constituent elements of the organic EL device according to the second embodiment of the invention. FIG. 6A is a sectional view taken along the line VIA-VIA of FIG. 5. FIG. 6B is a sectional view taken along the line VIB-VIB of FIG. 5. FIG. 6C is a sectional view taken along the line VIC-VIC of FIG. 5.

A difference between the organic EL device according to this embodiment shown in FIG. 5 and the organic EL device according to the first embodiment in FIG. 3 is the configurations of the partition wall, the concave portion formed by the partition wall, and the auxiliary cathode wire.

That is, in the organic EL device according to this embodiment, as shown in FIG. 5, the partition walls 34 are constituted by first partition walls 34a and second partition walls 34b. In addition, the concave portions 15 formed on the sides of the first partition walls 34a and the second partition walls 34b, that is, between the first partition walls 34a and the second partition walls 34b are also constituted by first concave portions 15a and second concave portions 15b. The first partition walls 34a are formed in a narrow long rectangular shape in plan view and arranged at a predetermined interval horizontally and vertically in FIG. 5. The second partition walls 34b is formed in rectangular shape smaller than that of the first partition walls 34a in plan view and arranged at a predetermined interval horizontally and vertically like the first partition walls 34a. In addition, the first partition walls 34a and the second partition walls 34b are independently formed in an island shape. Accordingly, the first partition walls 34a and the second partition walls 34b are spaced from each other. In addition, the first partition walls 34a and the second partition walls 34b are deviated from each other horizontally and vertically. Accordingly, when the first partition walls 34a and the second partition walls 34b are viewed obliquely in the drawing, the first partition walls 34a and the second partition walls 34b are arranged in an alternative manner.

With such a configuration, each of the first concave portions 15a is formed on one side (longer side) of each of the first partition walls 34a and each of the second concave portions 15b is formed on the other side (shorter side) of each of the first partition walls 34a. That is, each of the concave portions 15a is interposed between the longer sides of one pair of adjacent first partition walls 34a and between the longer sides of one pair of adjacent second partition walls 34b. An area where the organic EL element 70 is formed, that is, the opening 32a of the insulating film 32 is arranged in the first concave portion 15a. In addition, each of the second concave portions 15b is interposed between the shorter sides of one pair of adjacent first partition walls 34a and between the shorter sides of one pair of adjacent second partition walls 34b. Since the pixel electrode 20 and the function layer 40 are not formed in the second concave portion 15b and thus the organic EL element 70 is not formed, the second concave portion 15b becomes a non-formation area of the organic EL element 70.

Like the first embodiment, in each of the first concave portions 15a, the pixel electrode 20 is disposed within the opening 32a and the sub-pixel X is formed. As for the sub-pixels X, red sub-pixels X, green sub-pixels X, and green sub-pixels X are arranged in the first concave portions 15a, respectively. Like the first embodiment, the same color sub-pixels X are arranged vertically in the drawing and the red sub-pixels X, the green sub-pixels X, and the green sub-pixels X are arranged horizontally in this order in an alternative manner, for example. In addition, the function layer 40 forming the respective color sub-pixel X is selectively formed in the entire area inside the first concave portion 15a by a mask vapor-deposition method or the like.

In the second concave portions 15b, the auxiliary cathode wires 50 are formed to intersect the second partition walls 34b horizontally, that is, in a direction of the longitudinal side of the second partition walls 34b. Each of the auxiliary cathode wires 50 is arranged to cover the insulating film 32 exposed to the second concave portion 15b and the second partition wall 34b and is not formed on the function layer 40, unlike the first embodiment.

As shown in FIG. 6A, the organic EL element 70 is formed on the opening 32a of the insulating film 32 in the first concave portion 15a, similarly to the configuration shown in FIG. 4A. In this way, the sub-pixels X are formed.

In the second embodiment, since the common electrode 60 is formed of MgAg so as to have a thickness of about 10 nm, a large step difference is formed between the first partition wall 34a having a height of about 2 μm and the function layer 40 within the first concave portion 15a. Accordingly, step disconnection (line disconnection) may occur in the boundary (boundary between the first partition wall 34a and the function layer 40) or the like, described above. Even though not shown, since the second partition wall 34b and the first partition wall 34a have the same height, step disconnection (line disconnection) may also occur between the second partition wall 34b and the function layer 40 within the first concave portion 15a, like the common electrode 60.

In this embodiment, as shown in FIG. 6B, the common electrode 60 is in contact with each of the auxiliary cathode wires (auxiliary electrodes) 50 in each of the second concave portions 15b at location where the first concave portion 15a and the second concave portion 15b are joined with each other, that is, a location passing between the first partition wall 34a and the second partition wall 34b adjacent to each other obliquely. The common electrode 60 is in contact with each of the auxiliary cathode wires 50 within the first concave portion 15a and the second concave portion 15b where both the first partition wall 34a and the second partition wall 34b are not formed and thus the step disconnection does not occur due to the first partition wall 34a and the second partition wall 34b.

Since each of the auxiliary cathode wire 50 has the thickness of about 200 nm and thus has the sufficient thickness than the thickness of the common electrode 60, as described above, each of the auxiliary cathode wires 50 is in contact with the common electrode 60 on each of the second partition wall 34b without the step disconnection (line disconnection) caused by the step difference occurring due to the second partition wall 34b, as shown in FIG. 6C. Accordingly, even in a case where the line disconnection occurs between the common electrode 60 within the first partition wall 34a and the common electrode 60 within the first concave portion 15a due to the step difference of the first partition wall 34a, the common electrode 60 on each of the first partition walls 34a and on each of the second partition walls 34b is electrically connected to the function layer 40 within the first concave portion 15a, since the common electrode 60 is conductively connected to the inside of each of the first concave portions 15a through the auxiliary cathode wire 50 on the second partition wall 34b and within the second concave portion 15b.

In the organic EL device according to this embodiment, the common electrode 60 on each of the first partition walls 34a or on each of the second partition walls 34b is conductively connected to the common electrode 60 within each of the concave portions 15 through the auxiliary cathode wire 50, even when the step disconnection (line disconnection) occurs in the common electrode 60 due to the step difference of each of the first partition walls 34a. Accordingly, it is possible to satisfactorily light on and off the sub-pixels X formed by the organic EL elements 70 (light emission elements). Moreover, since irregularity of brightness is solved by providing the auxiliary cathode wires 50, a high quality display performance without display unevenness such as light emission unevenness or brightness unevenness can be realized.

In the second embodiment, the shape of the first partition walls 34a and the second partition walls 34b is configured to be rectangular in plan view, but any shape such as a circular shape or an elliptical shape can be used, as long as light emission of the sub-pixels X (the organic EL elements 70) is not affected. It is preferable that a shape of a circular arc pattern is used than a shape having an acute angle pattern in consideration that the sealing layer formed on the common electrode 60 is rotated together or a pinhole easily occurs.

The sub-pixel X corresponding to one of red (R), green (G), and blue (B) colors is arranged within the first concave portion 15a formed between the longer sides of the first partition walls 34a. However, the sub-pixels X individually corresponding to three red (R), green (G), and blue (B) colors may be formed within one first concave portion 15a, so that pixels formed by the sub-pixels X corresponding to the three colors are arranged within one first concave portion 15a. Alternatively, plural pixels may be arranged within one first concave portion 15a.

In the second embodiment, as shown in FIG. 5, the auxiliary cathode wires 50 are arranged horizontally in the drawing. However, the auxiliary cathode wires 50 may be arranged vertically in the drawing so as to passing above the first partition walls 34a and the second concave portions 15b.

In the second embodiment, the auxiliary cathode wires 50 are arranged in the entire rows in which the second concave portions 15b are arranged horizontally. However, the auxiliary cathode wires 50 may not be formed in all the rows and thin out to some extent, as long as the wire resistance in the common electrode 60 is rarely affected.

Third Embodiment

Figure 7:
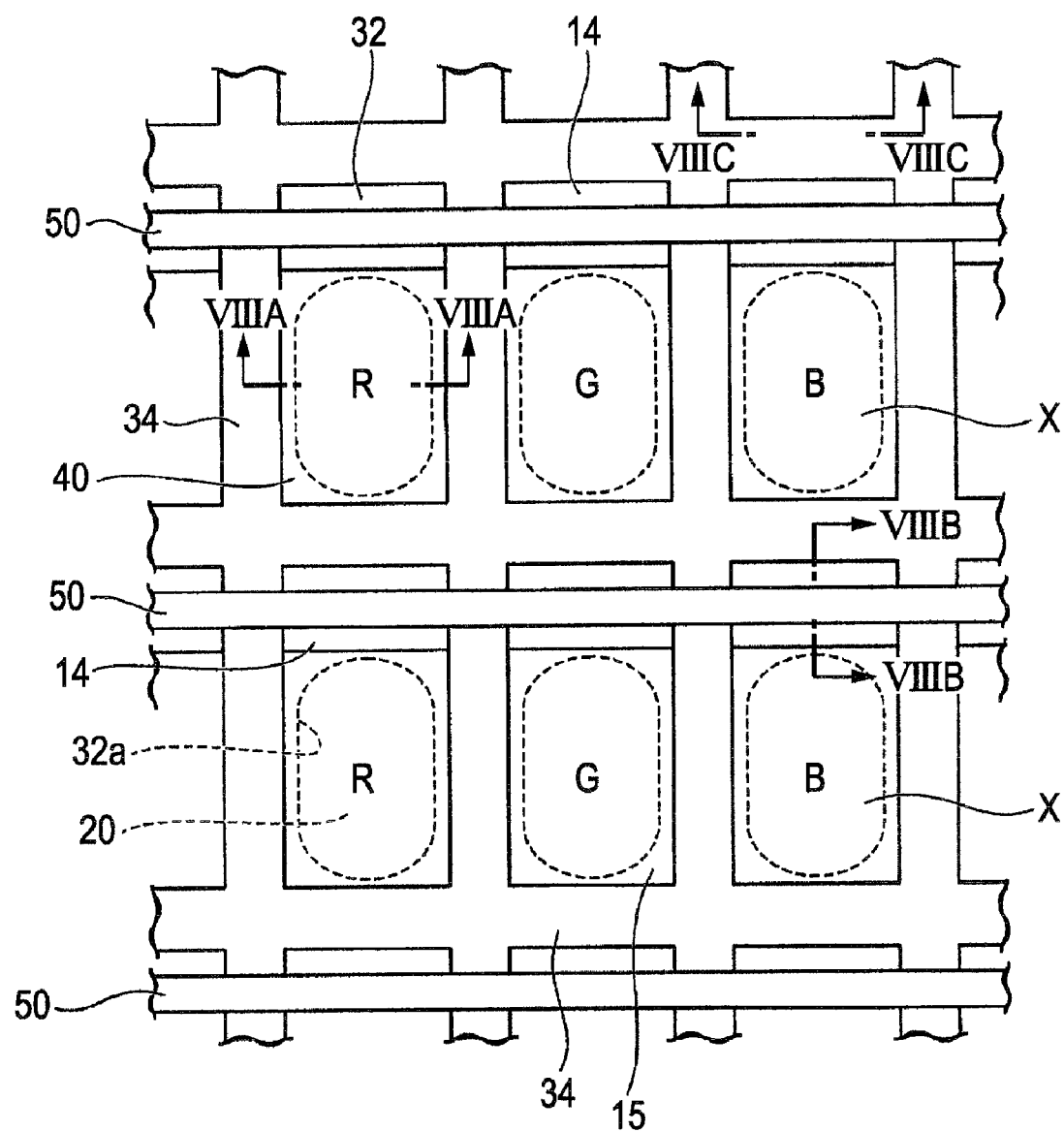
FIG. 7 is an enlarged top illustrating major constituent elements of the organic EL device according to a third embodiment.
Figure 8A:
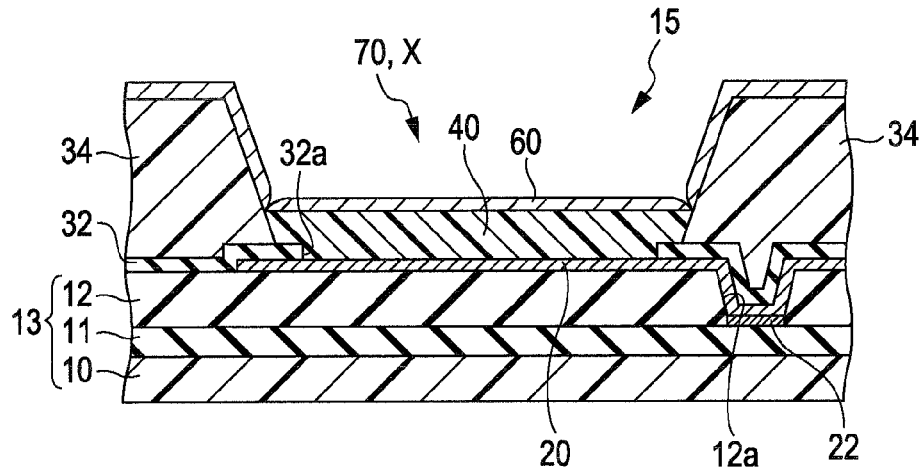
FIGS. 8A to 8C are sectional view of FIG. 7.
Figure 8B:
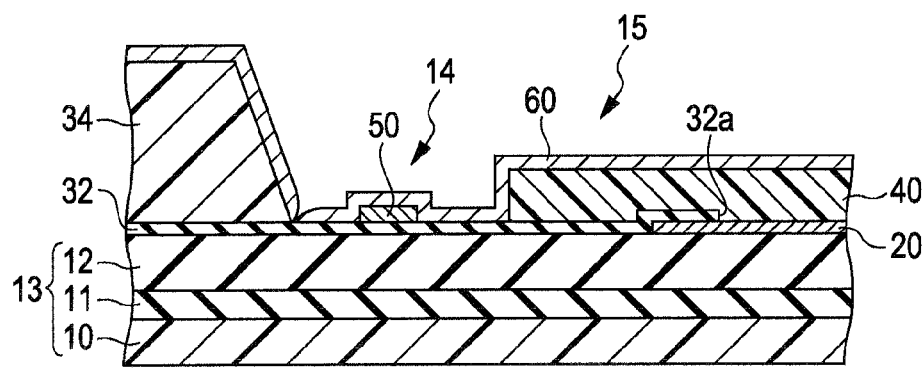

Next, an organic EL device will be described according to a third embodiment of the invention. FIG. 7 is an enlarged top illustrating major constituent elements of the organic EL device according to the third embodiment of the invention. FIG. 8A is a sectional view taken along the line VIIIA-VIIIA of FIG. 7. FIG. 8B is a sectional view taken along the line VIIIB-VIIIB of FIG. 7. FIG. 8A is a sectional view taken along the line VIIIC-VIIIC of FIG. 7.

A difference between the organic EL device according to this embodiment shown in FIG. 7 and the organic EL device according to the first embodiment in FIG. 3 is the configurations of the partition wall, the concave portion formed by the partition wall, and the auxiliary cathode wire.

That is, in the organic EL device according to this embodiment, as shown in FIG. 7r the partition walls 34 are not arranged in the stripe shape, but arranged horizontally and vertically in a lattice shape. Each of portions surrounded by the partition walls 34 and having a rectangular shape in plan view is formed as the concave portion 15. Both the formation area and the non-formation area of the organic EL element 70 are arranged within the concave portion 15. That is, the opening 32a of the insulating film 32 which becomes the formation area of the organic EL element 70 is formed within the concave portion 15. In addition, the non-formation area 14 of the organic EL element 70 where the opening 32a is not formed and the function layer 40 is not also arranged is formed on the side of the concave portion 15 (the upper portion in FIG. 7, that is, an area surrounded by the partition wall 34 and the function layer 40).

Within the opening 32a in each of the concave portions 15, the pixel electrode 20 is arranged in the formation area (extending from the middle portion to the lower portion in the drawing) of the organic EL element 70, and thus the sub-pixel X is formed. As for the sub-pixels X, the red sub-pixel X, the green sub-pixel X, and the blue sub-pixel X are arranged in the concave portions 15, respectively. Like the first embodiment, the respective same color sub-pixels X are arranged vertically in the drawing and the red sub-pixel X, the green sub-pixel X, and the blue sub-pixel X are arranged horizontally in this order in the alternative manner, for example. In addition, the function layer 40 forming the respective color sub-pixel X is selectively formed in the entire area other than the non-formation area 14 inside the concave portion 15 by a mask vapor-deposition method or the like.

In the concave portions 15, the auxiliary cathode wires 50 are formed horizontally in the non-formation areas 14 formed in the upper portions in the drawing to intersect the non-formation areas 14. Each of the auxiliary cathode wires 50 is arranged to cover the insulating film 32 exposed to the concave portion 15 and the partition wall 34 and is not formed on the function layer 40, like the second embodiment.

As shown in FIG. 8A, the organic EL element 70 is formed on the opening 32a of the insulating film 32 in the concave portion 15, similarly to the configuration shown in FIG. 4A. In this way, the sub-pixels X are formed.

In the third embodiment, since the common electrode 60 is formed of MgAg so as to have a thickness of about 10 nm, a large step difference is formed between the partition wall 34 having a height of about 2 μm and the function layer 40 within the concave portion 15. Accordingly, step disconnection (line disconnection) may occur in the boundary (boundary between the partition wall 34 and the function layer 40) or the like, described above.

In this embodiment, as shown in FIG. 8B, in the concave portion 15, the common electrode 60 is formed continuously between the upper layer of the function layer 40 in the formation area and the upper layer of the auxiliary cathode wire 50 formed in the non-formation area 14. That is, the step difference is rarely present in the concave portion 15. Accordingly, the common electrode 60 covers each of the auxiliary cathode wires 50 to be satisfactorily connected to the auxiliary cathode wires 50.

Figure 8C:
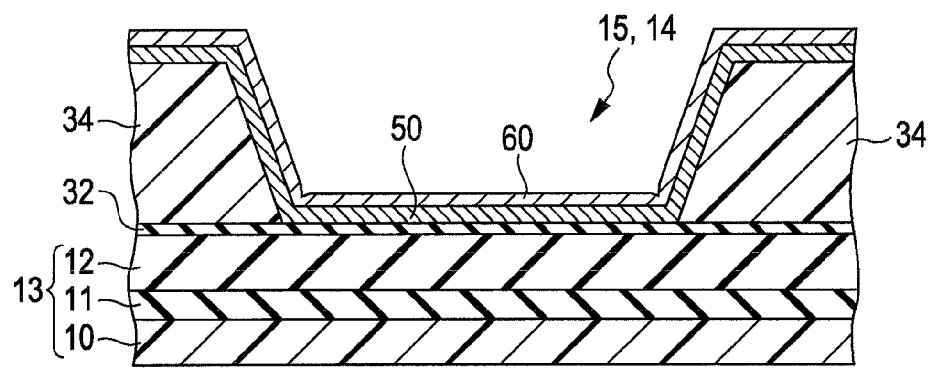

Since each of the auxiliary cathode wire 50 has the thickness of about 200 nm and thus has the sufficient thickness than the thickness of the common electrode 60, as described above, each of the auxiliary cathode wires 50 is in contact with the common electrode 60 on each of the partition wall 34 without the step disconnection (line disconnection) caused by the step difference occurring due to the partition wall 34, as shown in FIG. 8C. Accordingly, even in a case where the line disconnection occurs between the common electrode 60 on the partition wall 34 and the common electrode 60 within the concave portion 15 due to the step difference of the partition wall 34, the common electrode 60 on each of the partition walls 34 is electrically connected to the function layer 40 within the concave portion 15, since the common electrode 60 is conductively connected to the inside of each of the concave portion 15 through the auxiliary cathode wire 50 on the partition wall 34.

In the organic EL device according to this embodiment, the common electrode 60 on each of the partition wall 34 is conductively connected to the common electrode 60 within each of the concave portions 15 through the auxiliary cathode wire 50, even when the step disconnection (line disconnection) occurs in the common electrode 60 due to the step difference of each of the partition wall 34. Accordingly, it is possible to satisfactorily light on and off all the sub-pixels X formed by the organic EL elements 70 (light emission elements). Moreover, since irregularity of brightness is solved by providing the auxiliary cathode wires 50, a high quality display performance without display unevenness such as light emission unevenness or brightness unevenness can be realized.

In the third embodiment, the sub-pixel X corresponding to one of red (R), green (G), and blue (B) colors is arranged within the concave portion 15. However, the sub-pixels X individually corresponding to three red (R), green (G), and blue (B) colors may be formed within one concave portion 15, so that pixels formed by the sub-pixels x corresponding to the three colors are arranged within one concave portion 15. Alternatively, plural pixels may be arranged within one concave portion 15.

In the third embodiment, the auxiliary cathode wires 50 are arranged between the sub-pixels X arranged in the direction of the longer side of the concave portion 15 having the rectangular shape. However, the auxiliary cathode wires 50 may not be formed between all the sub-pixels X and thin out to some extent, as long as the wire resistance in the common electrode 60 is rarely affected.

The invention is not limited to the embodiments describe above, but may be modified in various forms without departing the gist of the invention. For example, in the first, second, and third embodiments, the light emission layers of the function layers 40 respectively emit the red (R) light, the green (G) light, and the blue (B) light. However, a full color display can be realized by commonly providing an organic light emission layer (the function layer 40) emitting white light in an upper portion (including a portion above the concave portion and the partition walls) of the substrate 10 and by forming color filters on the inner surface of a protective member (sealing substrate) formed above the common electrode (cathode) 60.

In the embodiment described above, the light emission layer is formed by the vapor-deposition method using the low-molecular material as the material for forming the light emission layer in the function layer 40. However, a polymer-based material can be used. In this case, the light emission layer can be used by a liquid phase method such as ink jet method (liquid droplet ejecting method).

Electronic Apparatus

Figure 9:
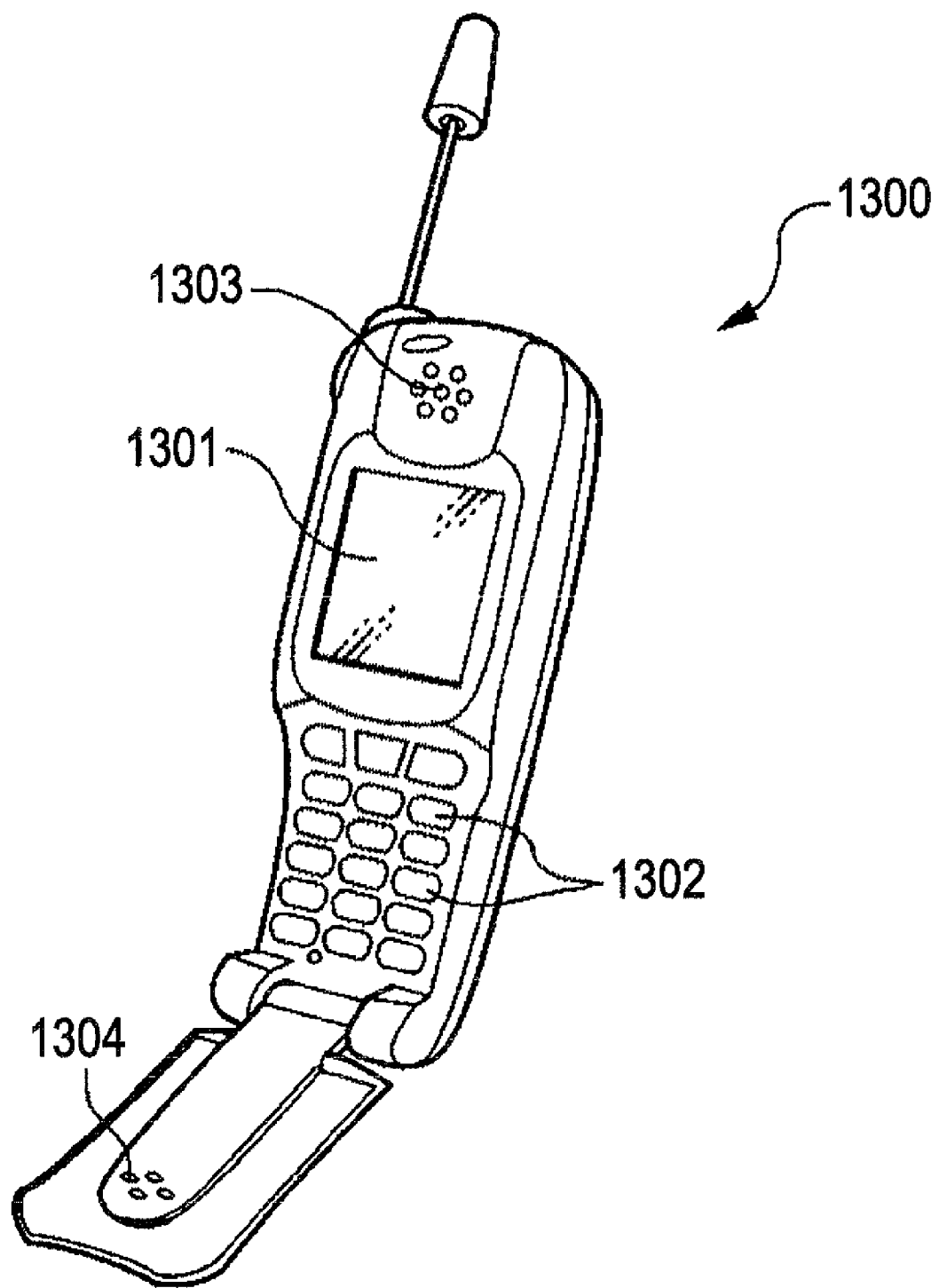
FIG. 9 is a schematic diagram illustrating an electronic apparatus including the organic EL device according to the invention.

Next, an application example of the organic EL device according to the invention will be described. FIG. 9 is a perspective view illustrating an example of an electronic apparatus using the organic EL device according to the invention. A cellular phone 1300 shown in FIG. 9 includes a display unit 1301 configured by the small size of the organic EL device according to the invention, plural operation buttons 1302, an ear piece 1303, and a mouth piece 1304. With such a configuration, the cellular phone 1300 including the display unit configured by the organic EL device according to the invention and excellent in a display quality can be realized.

The organic EL device according to the invention is not limited to the above cellular phone. The organic EL device can be used as an image display unit such as an electronic book, a projector, a personal computer, a digital still camera, a television receiver, a view finder type or monitor direct vision-type video recorder, a car navigation apparatus, a pager, an electronic pocket book, a calculator, a word processor, a workstation, a television phone, a POS terminal, and an apparatus having a touch panel.

The entire disclosure of Japanese Patent Application No. 2008-119862, filed May 1, 2008 is expressly incorporated by reference herein.

What is claimed is:

1. An organic electroluminescence device which includes an organic electroluminescence element having a function layer interposed between a first electrode and a second electrode, wherein the function layer includes at least an organic light emission layer,
   wherein the electroluminescence device includes:
   a substrate,
   partition walls formed above the substrate, the partition walls define concave portions and each of formation areas of the organic electroluminescence element within each of the concave portions to arrange the function layer within the concave portion; and
   auxiliary electrodes located between the second electrode and the substrate, each of the auxiliary electrodes being arranged continuously on the partition wall and within the concave portion,
   wherein the second electrode is formed in an area where both the formation area of the organic electroluminescence element and a non-formation area of the organic electroluminescence element overlap with each other, so as to be electrically connected to the function layer and the auxiliary electrode and is formed continuously between the function layer arranged within the concave portion and the auxiliary electrode in a state where the second electrode contacts with the auxiliary electrode and the function layer arranged within the concave portion,
   wherein the auxiliary electrode is formed to be thicker than the second electrode, and
   wherein a top surface of the auxiliary electrodes that is within the concave portion is below a top surface of the partition walls.

2. The organic electroluminescence device according to claim 1,
   wherein the partition walls are arranged in a stripe shape and the concave portions are arranged in a stripe shape between the partition walls, and
   wherein the auxiliary electrodes are arranged in a stripe shape intersecting the partition walls.

3. The organic electroluminescence device according to claim 2, wherein the first electrode is formed in an island shape in an area defined by one pair of adjacent partition walls and one pair of adjacent auxiliary electrodes.

4. The organic electroluminescence device according to claim 1, wherein each of the concave portions formed on the sides of the partition walls includes a first concave portion for arranging the formation area of the organic electroluminescence element and a second concave portion for arranging the non-formation area of the organic electroluminescence element and providing the auxiliary electrode.

5. The organic electroluminescence device according to claim 1, wherein the concave portion is surrounded by the partition walls, the function layer is arranged in the formation area of the organic electroluminescence element within the concave portion, and the auxiliary electrode is arranged in the non-formation area of the organic electroluminescence element within the concave portion, so that the second electrode is continuously formed between the auxiliary electrode and the function layer arranged within the concave portion.

6. The organic electroluminescence device according to claim 1, wherein the second electrode is formed of MgAg.

7. The organic electroluminescence device according to claim 1, wherein the auxiliary electrode is formed of a material having a higher conductive property than that of the second electrode.

8. The organic electroluminescence device according to claim 1, wherein the auxiliary electrode has a thickness of 200 nm or more.

9. The organic electroluminescence device according to claim 1, wherein the auxiliary electrode is formed by a mask vapor-deposition method.

10. The organic electroluminescence device according to claim 1, wherein the auxiliary electrode is formed of Al.

* * * * *